United States Patent
Ogura

(10) Patent No.: US 6,548,379 B1
(45) Date of Patent: Apr. 15, 2003

(54) SOI SUBSTRATE AND METHOD FOR MANUFACTURING THE SAME

(75) Inventor: Atsushi Ogura, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/786,247

(22) PCT Filed: Aug. 23, 1999

(86) PCT No.: PCT/JP99/04543
§ 371 (c)(1),
(2), (4) Date: Aug. 23, 1999

(87) PCT Pub. No.: WO00/13214
PCT Pub. Date: Mar. 9, 2000

(30) Foreign Application Priority Data

Aug. 31, 1998 (JP) .......................................... 10-245234
Oct. 9, 1998 (JP) .......................................... 10-303346

(51) Int. Cl.$^7$ ..................... H01L 21/20; H01L 21/31; H01L 21/425; H01L 27/01
(52) U.S. Cl. ..................... 438/480; 438/526; 438/530; 438/766; 257/347
(58) Field of Search .............................. 438/162, 526, 438/528, 530, 766, 480; 257/347

(56) References Cited

U.S. PATENT DOCUMENTS

| | | | | |
|---|---|---|---|---|
| 4,962,051 A | * | 10/1990 | Liaw | 438/474 |
| 5,278,077 A | * | 1/1994 | Nakato | 438/517 |
| 5,468,657 A | * | 11/1995 | Hsu | 438/766 |
| 5,589,407 A | * | 12/1996 | Meyyappan et al. | 438/475 |
| 6,313,014 B1 | * | 11/2001 | Sakaguchi et al. | 438/475 |

FOREIGN PATENT DOCUMENTS

| | | | |
|---|---|---|---|
| JP | 63-316469 | 12/1988 | |
| JP | 9-260621 | 10/1997 | |
| JP | 9-260622 | 10/1997 | |
| JP | 9-293846 | 11/1997 | |
| JP | 10-0412421 A | * 2/1998 | ......... H01L/21/265 |
| JP | 10-79355 | 3/1998 | |

OTHER PUBLICATIONS

Applied Physics Letters, Oct. 13, 1997, vol 71, No. 15, S. Bagchi et al., "Dose dependence of microstructural development of buried oxide in oxygen implanted silicon–on–insulator material".
Journal of Applied Physics, Feb. 1, 1991, vol. 69, No. 3, S. Visitserngtrakul et al., "Formation of multiply faulted defects in oxygen implanted silicon–on–insulator material".
Nuclear Instruments and Methods in Physics Research, (1994) pp. 520–524, Y. Ishikawa et al, "Formation mechanisms of dislocation and Si island on low–energy SIMOX".

* cited by examiner

Primary Examiner—Amir Zarabian
Assistant Examiner—Toniae M. Thomas
(74) Attorney, Agent, or Firm—Katten Muching Zavis Rosenman

(57) ABSTRACT

A SOI substrate includes a SiO$_2$ film (230) having a center located at the depth of the damage peak where the crystal damage is maximum after the Si substrate (10) is ion-implanted with oxygen ions. Even if a crystal defect (240) remains at the depth of the density peak where the density is maximum, the crystal defect does not effect the device operation because it is outside the active layer. By using a low-dose SIMOX process, a lower-cost SOI substrate can be obtained wherein crystal defects formed in the active layer are reduced.

13 Claims, 3 Drawing Sheets

IMMEDIATELY AFTER ION IMPLANTATION

EARLY STAGE OF HEAT TREATMENT

AFTER HEAT TREATMENT

AFTER ADDITIONAL HEAT TREATMENT

IMMEDIATELY AFTER ION IMPLANTATION

- 30 DAMAGE PEAK
- 20 DENSITY PEAK
- 10 SUBSTRATE

EARLY STAGE OF HEAT TREATMENT

- 130
- 120

AFTER HEAT TREATMENT

- 230
- 220
- 240

AFTER ADDITIONAL HEAT TREATMENT

- 230

IMMEDIATELY AFTER ION IMPLANTATION

- 30 DAMAGE PEAK
- 20 DENSITY PEAK
- 10 SUBSTRATE

EARLY STAGE OF HEAT TREATMENT

- 130
- 120

AFTER HEAT TREATMENT

- 230
- 220
- 240

ADDITIONAL HEAT TREATMENT

- 220
- 240

SOI SUBSTRATE AND METHOD FOR MANUFACTURING THE SAME

TECHNICAL FIELD

The present invention relates to an SOI (Si-on-insulator) substrate which has a semiconductor layer formed on an insulator and is a promising candidate for the substrate material of the next generation LSI, and a method for manufacturing the same.

BACKGROUND ART

Methods of forming the SOI structure which has a semiconductor active layer on an insulator include, for example, the SIMOX (separation by implanted oxygen) process described in the Journal of Material Research, vol.8, No.3, pp.523–534, 1993. In the SIMOX process, oxygen ions (O+) are implanted in a silicon substrate (Si substrate) followed by heat treatment at a high temperature, so that an oxide film ($SiO_2$ film) which continues in a direction parallel to the substrate surface is formed inside of the substrate, with the center of the film located at a depth in the substrate where the oxygen concentration produced by the oxygen ion implantation is maximum (density peak). The density peak is formed at a position of the mean range path (Rp) of accelerated oxygen ions.

With the SIMOX process, although an SOI substrate can be obtained relatively easily, there is such a drawback that a number of crystal defects (dislocation, stacking fault) remain at the position of damage peak, where the damage generated during the oxygen ion implanation is maximum, in the Si active layer which is the region where devices are formed. The damage peak is formed at a depth where the oxygen ion with the given acceleration energy has the highest probability to collide with an Si atom, and usually the depth is three fourths (¾) of the depth of the density peak.

In order to reduce the crystal defects generated at the position of damage peak, for example, Japanese Patent Laid-Open Publication No.Hei. 10-79355 proposes a technology of replacing the damage peak with an $SiO_2$ film by carrying out oxygen ion implantation and high temperature heat treatment processes followed by oxidation at a high temperature. With this technology, the damage layer is absorbed by increasing the thickness of a surface oxide film or a buried oxide film. However, since the buried $SiO_2$ film is not formed directly at the position of damage peak, it is difficult to control and there is such a problem that crystal defects remain in the SOI active region which is interposed between the surface oxide film and the buried oxide film.

As described above, in spite of the advantage that the SOI substrate can be obtained relatively easily, the SIMOX process has the drawback that the crystal defects remain in the upper Si active layer which is the region where the device is formed. Also there is such a problem that it is difficult to completely eliminate the crystal defects even when the high-temperature oxidation is carried out for the reduction of the crystal defects.

In view of the foregoing, an object of the present invention is to solve the problems of the SIMOX process described above and provide an SOI substrate that includes less crystal defects in the Si active layer and a method for manufacturing the same.

DISCLOSURE OF THE INVENTION

In order to achieve the object described above, the SOI substrate of the present invention has a buried $SiO_2$ film which continues in a direction parallel to the main surface of a silicon substrate and a plurality of $SiO_2$ islands disposed below the buried $SiO_2$ film, while being arranged in a direction substantially parallel to the main surface. Or, alternatively, a second $SiO_2$ film which continues in the direction parallel to the main surface of the substrate may be formed, instead of the plurality of $SiO_2$ islands, below the $SiO_2$ film.

A method for manufacturing the SOI substrate according to the present invention in the first aspect is a method for manufacturing the SOI substrate of the present invention including the steps of implanting oxygen ions in a silicon substrate, raising the ambient temperature of the silicon substrate wherein the temperature is raised at a rate not higher than 1° C./minute over a range of at least 100° C. above a temperature higher than 600° C. while the oxygen concentration in the atmosphere is kept at a level of 0.5% or higher, and performing a heat treatment where the silicon substrate is kept at a temperature not lower than 1200° C. for a predetermined period of time.

A method for manufacturing the SOI substrate according to the present invention in the second aspect includes the steps of:

implanting oxygen ions in a silicon substrate to form a damage peak where crystal defects generated by the ion implantation is maximum and a density peak where a concentration of the implanted oxygen ions is maximum in the silicon substrate; and forming an $SiO_2$ film extending in a direction parallel to a main surface of the silicon substrate and having a center of the $SiO_2$ film located substantially at the damage peak.

According to the present invention, since the crystal defects generated in the Si active layer can be reduced when the SOI structure is formed by a low-dose SIMOX process, the SOI substrate having a satisfactory active layer can be obtained by the low-cost, low-dose SIMOX process.

The SOI substrate of the present invention can be formed by the SOI substrate manufacturing method of the present invention, and has the $SiO_2$ film which continues in the direction parallel to the substrate surface with the center of the film located at the damage peak where the crystal defects (damage) generated during the oxygen ion implantation are maximum. With such a constitution being employed, since the residual crystal defects are mostly located below the $SiO_2$ film and are isolated by the $SiO_2$ film from the Si active layer, the Si active layer having less crystal defects can be obtained. In this case, a plurality of $SiO_2$ islands are formed around the position of the density peak of the oxygen concentration, as the center thereof, below the $SiO_2$ film during the heat treatment. Depending on the heat treatment condition, or by applying an additional heat treatment, the $SiO_2$ islands may substantially disappear or may be turned into a second $SiO_2$ film.

BEST MODES FOR CARRYING OUT THE INVENTION

The present inventors closely studied the mechanism in which the SOI structure is formed in the common SIMOX process. It was found accordingly that, under the conditions of 180 KeV in acceleration energy and a higher dosage of above $1.2\times10^{18}/cm^2$, an oxide film which continued in a direction parallel to the substrate surface was already formed immediately after the ion implantation. As the surrounding oxygen atoms are gathered in the subsequent high-temperature heat treatment, the oxide film increases in thickness or strength thereby completing the SOI structure. With a lower dosage of below $1.2\times10^{10}/cm^2$, extremely fine islands of oxide are scattered immediately after the ion implantation, while some of the number of the islands of oxide grow and part of the rest disappear in the subsequent high-temperature heat treatment, so that the plurality of grown islands of oxide unite into a continuous oxide film. The former process is referred to as high-dose SIMOX and the latter process is referred to as low-dose SIMOX. The low-dose SIMOX process has an advantage of less damage given to the active layer due to less amount of ion implantation and shorter implantation time, and is therefore increasingly employed.

Figure 3A:
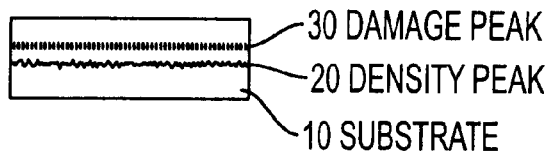
FIG. 3 is a sectional view showing an SOI substrate in different stages in the process according to the SOI substrate manufacturing method of the prior art.
Figure 3B:
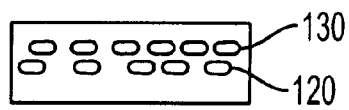

Closer study of the forming process of the low dose SIMOX of the prior art reveals that, as shown in FIG. 3(a), immediately after the oxygen ion implantation in the Si substrate 10, a damage peak 30 where the implantation damage is maximum and a density peak 20 where the implanted oxygen concentration is highest exist, although such $SiO_2$ grains are not formed that can be observed with an electron microscope of up to about 100,000 times magnification. When the Si substrate is subjected to heat treatment at a temperature of 1200° C. or higher precipitation of oxygen starts in both the damage peak 30 and the density peak 20 during the heat-up process or at an early stage of the heat treatment process, thereby to form $SiO_2$ islands 130 precipitated at the position of the damage peak 30 and $SiO_2$ islands 120 precipitated at the position of the density peak 20, as shown in FIG. 3(b).

Figure 3C:
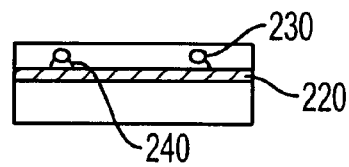
Figure 3D:
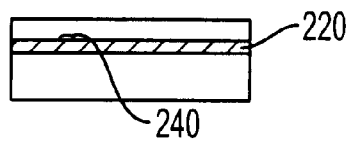

As the heat treatment proceeds further, the $SiO_2$ islands 120 precipitated at the position of the density peak 20 grow and unite thereby to form an $SiO_2$ film 220 which continues in a direction parallel to the substrate surface, as shown in FIG. 3(c). At this time, the $SiO_2$ islands 130 precipitated at the position of the damage peak 30 supply oxygen to the $SiO_2$ island 120 precipitated at the position of the density peak 20 during the growth thereof, so that the size and density thereof decrease and residual $SiO_2$ islands 230 remain at the position of the damage peak 30. Crystal defect 240 may sometimes appear to bridge the $SiO_2$ film 220 formed at the position of density peak 20 and the $SiO_2$ island 230 remaining at the position of damage peak 30. As the heat treatment proceeds further, the crystal defect 240 partly remains as shown in FIG. 3(d), and $SiO_2$ remains only in the form of $SiO_2$ film 320 which is formed at the position of density peak 20. Thus the residual $SiO_2$ island 230 disappears and the SOI substrate is completed.

Figure 1A:
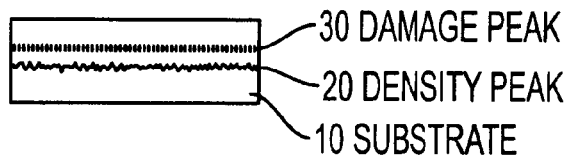
FIG. 1 is a sectional view showing an SOI substrate in different stages in the process according to the SOI substrate manufacturing method of the present invention.
Figure 1B:
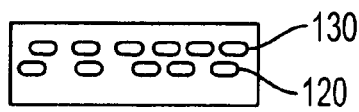
Figure 1C:
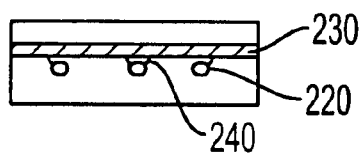
Figure 1D:
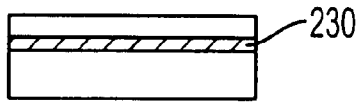

Based on the mechanism described above, the present invention provides the SOI substrate wherein the $SiO_2$ film is formed at the position of damage peak so that the crystal defect 240 does not exist in the active layer, as shown in FIG. 1(c) and FIG. 1(d). Now the invention will be described in detail below.

As shown in FIG. 1(a), in a stage immediately after oxygen ion implantation therein, an Si substrate 10 has such a structure that has the density peak 20 and the damage peak 30 similarly to the structure of the prior art shown in FIG. 3(a). When the substrate in this state is subjected to heat treatment, the $SiO_2$ islands 120 precipitated at the position of the density peak 20 and the $SiO_2$ islands 130 precipitated at the position of the damage peak 30 are formed during the raising step or in the early stage of the heat treatment as shown in FIG. 1(b). The process is similar to the SIMOX process of the prior art up to this point.

In contrast to the prior art where mainly the oxygen introduced into the Si substrate by ion implantation and the oxygen originally included in the Si substrate participate in the precipitation, the heat treatment of the present invention causes oxygen diffused from the heat treatment atmosphere into the Si substrate through the surface thereof is caused to participate in the precipitation by controlling the rate of temperature rise in the heat treatment and the oxygen concentration of the heat treatment atmosphere. When the heat treatment conditions are properly set, it is made possible to cause the oxygen introduced through the Si substrate surface to participate more predominantly in the oxygen precipitation at the damage peak 30 than in the oxygen precipitation at the density peak 20, since the damage peak 30 is nearer to Si substrate surface than the density peak 20 is. As a result, when the heat treatment is continued further, the $SiO_2$ islands precipitated at the position of the damage peak 30 grow to become larger than the $SiO_2$ islands precipitated at the position of the density peak 20, thereby forming the $SiO_2$ film 230 at the position of the damage peak 30, as shown in FIG. 1(c).

At this time, while the $SiO_2$ islands 220 that remain at the position of the density peak 20 usually diminish or disappear as the heat treatment proceeds, it is not necessary to continue the heat treatment until the $SiO_2$ islands completely disappear because the region where electronic devices are formed in the Si substrate is located above the $SiO_2$ film 230 which is formed at the position of the damage peak 30. Meanwhile such a phenomenon called the gettering process is well known as metal atoms or other contaminants introduced, either intentionally or accidentally, into the SOI substrate are captured in $SiO_2$ islands or the like thereby causing a favorable effect on the device characteristics, during the process of fabricating the device. Unlike the crystal defects of the prior art shown in FIG. 3(c) or FIG. 3(d), the crystal defect 240 remaining below the $SiO_2$ film 230 which is formed at the position of the damage peak 30 does not exist in the region where the SOI device is to be made and therefore not only causes no problem but even produces a good effect in view of the gettering process described above. As the heat treatment is continued further, the $SiO_2$ islands 220 remaining at the position of the density peak 20 and/or the crystal defect 240 disappear as shown in FIG. 1(d), so that an SOI substrate having a structure different from that shown in FIG. 3(d) can be obtained. By setting the heat treatment conditions properly, the $SiO_2$ islands 220 formed at the position of the density peak 20 can be grown to form an $SiO_2$ film which continues in the direction parallel to the main surface of the substrate, contrary to causing the $SiO_2$ islands to disappear.

EMBODIMENTS

Embodiments of the present invention will now be described below. It should be noted, however, that the present invention is not limited to the constitutions of the following embodiments.

Embodiment 1

Two sets of p-type Si substrates (resistivity in a range from 1 to 10 Ω·cm) having diameter of six inches and (100) orientation were kept at a temperature of about 600° C. and subjected to oxygen ion implantation with acceleration energy of 180 KeV and a dosage of $2\times10^{17}/cm^2$. Analysis of the Si substrate in this stage with position annihilation method and SIMS (secondary ion mass spectroscopy) showed that a damage peak which sustained maximum damage to the crystal was formed at a depth of about 0.31 micrometers from the surface, and a density peak having maximum concentration of the implanted oxygen was formed at a depth of about 0.44 micrometers.

One of the above samples was subjected to the known low-dose SIMOX process, wherein the temperature was raised from 1000° C. at a rate of 0.02° C./minute in an atmosphere of Ar including 0.5% of $O_2$ and, at a temperature of 1340° C. that was attained, heat treatment was applied for four hours. Thus through the course of processes shown in FIG. 3, an $SiO_2$ film which continued in the direction parallel to the substrate surface was formed at the position of the density peak 20, thereby completing the SOI substrate of the prior art. The other sample was subjected to the process of the present invention, wherein the temperature was raised from 1000° C. at a rate of 0.03° C./minute in an atmosphere of Ar including 1% of $O_2$ and, at a temperature of 1340° C. that was attained, heat treatment was applied for four hours. Thus through the course of processes shown in FIGS. 1(c) and 1(d), and $SiO_2$ film which continued in the direction parallel to the substrate surface and had a center located at the position of the damage peak 30 was formed, thereby completing the SOI substrate of the present invention.

Figure 2:
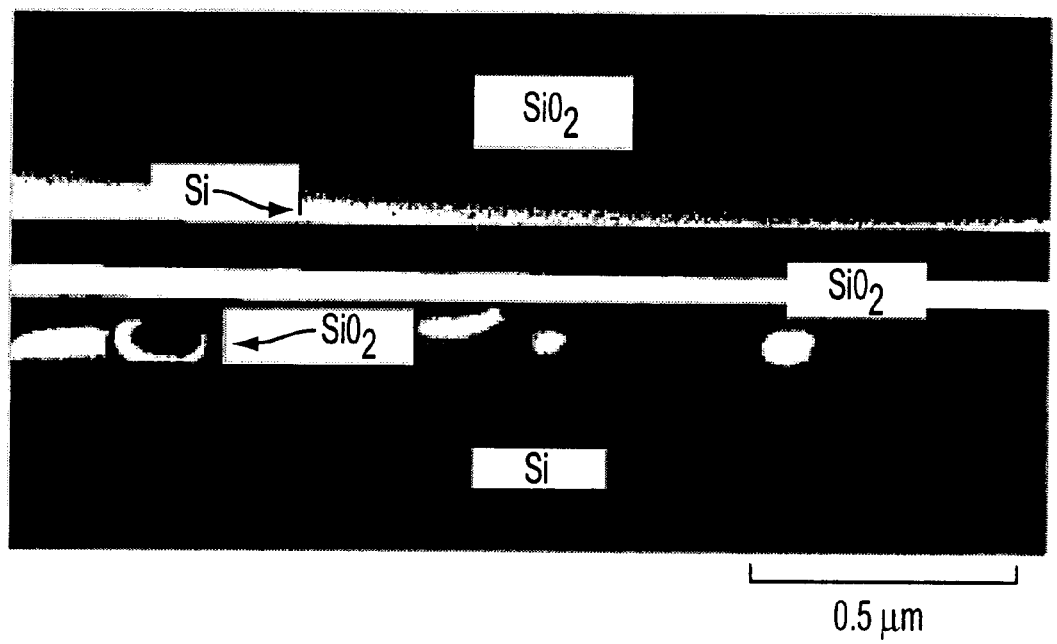
FIG. 2 is a bright field image photograph of an SOI substrate according to an embodiment of the present invention taken with a transmission electron microscope.

FIG. 2 is a bright field image of the sectional structure corresponding to FIG. 1(c), observed with a transmission electron microscope. FIG. 2 shows a difference from FIG. 1(o) is that an $SiO_2$ layer 250 exists on the top, which is generated by the oxidation of the Si surface by oxygen included in the atmosphere. The same structure as that of FIG. 1(c) is obtained by removing the surface $SiO_2$ layer 250 by HF etching or similar process. The surface $SiO_2$ layer 250 does not pose a trouble to the use of the SOI substrate, but rather can be used as a protective film that protects the surface till immediately before fabricating the devices.

Embodiment 2

Similarly to the first embodiment, a p-type Si substrate (resistivity in a range from 1 to 10 Ω·cm) having diameter of six inches and (100) orientation was kept at a temperature of about 600° C. and subjected to oxygen ion implantation with a dosage of $2\times10^{17}/cm^2$ and 180 KeV. The samples was then heated, at a rate of 0.04° C./ minute from 1000° C. upward, in an atmosphere of Ar including 5% of $O_2$ and, at a temperature of 1340° C. that was attained, heat treatment was applied for four hours. Thus through the process shown in FIG. 1, an $SiO_2$ film which continued in the direction parallel to the substrate surface with the center thereof located at the damage peak 30 was formed. Thus when heat treatment conditions different from those of the first embodiment are used, the SOI substrate of the present invention can be obtained by setting the rate of temperature rise, oxygen concentration and the like properly. Specifically, when the rate of temperature rise is set higher, oxygen concentration in the atmosphere is increased within such an extent that the $SiO_2$ film 250 to be formed on the substrate surface does not reach damage peak. The oxygen contribution concentration is set at least 0.5% or higher, preferably 0.8% or higher, and most preferably 1.0% or higher.

Embodiment 3

Similarly to the first embodiment, a p-type Si substrate (resistivity in a range from 1 to 10 Ω·cm) having diameter of six inches and (100) orientation was kept at a temperature of about 600° C. and subjected to oxygen ion implantation with a dosage of $3\times10^{17}/cm^2$ and 180 KeV. The sample was heated at a rate of 1° C./minute in a temperature range from 1000° C. to 1200° C. and at a rate of 20° C./minute in other temperature range in an atmosphere of Ar including 10% of $O_2$ and, at a temperature of 1340° C. that was applied, heat treatment was attained, was applied for four hours. Thus through the process shown in FIG. 1, an $SiO_2$ film which continued in the direction parallel to the substrate surface with the center thereof located at the damage peak 30 was formed. This embodiment is an example of employing a dose of oxygen implantation different from those of the first and second embodiments and setting proper conditions such as the rate of temperature rise and oxygen concentration in the atmosphere. Through closer examination, it was confirmed that the method of the present invention can be carried out as long as the dose of ion implantation is such an extent as that an $SiO_2$ film is not formed immediately after the ion implantation, namely the dose of oxygen is not higher than about $1.2\times10^{18}/cm^2$, provided that the acceleration energy is 180 keV. When the acceleration energy is 180 keV, damage peak is formed at a depth of about 0.31 micrometers from the substrate surface, and density peak is formed at a depth of about 0.44 micrometers.

In the embodiments described above, the substrate may be either p-type or n-type, and any orientation may be employed such as (111) and (110) instead of (100). Also the value of resistivity is not limited to that described above. Acceleration energy of the oxygen ions is not limited to 180 keV, and may be set in a practical range, for example from 80 to 300 keV, approximately, and preferably from 150 to 200 keV, approximately. Heat treatment temperature may be in a range from 1200° C. upward below the melting point of Si. When raising the temperature, the rate of temperature rise and oxygen concentration in the atmosphere at temperatures above 600° C. are important factors, and the rate of temperature rise and the oxygen concentration are controlled within predetermined ranges over a temperature range of at least 100° C.

The present invention has been described by way of preferred embodiments thereof, but it should be noted that the present invention is not limited to the constitutions of the embodiments described have and various modifications and changes can be made therefrom.

What is claimed is:

1. A SOI substrate comprising at $SiO_2$ film formed in a silicon substrate and extending substantially parallel to a main surface of said silicon substrate, and a plurality of $SiO_2$ islands substantially all disposed below said $SiO_2$ film and arranged in a direction substantially parallel to said main surface.

2. A SOI substrate comprising a $SiO_2$ film formed in a silicon substrate and extending substantially parallel to a main surface of said silicon substrate, a plurality of $SiO_2$ islands disposed below said $SiO_2$ film and arranged in a direction substantially parallel to said main surface, and a crystal defect bridging said $SiO_2$ film and one of said $SiO_2$ islands.

3. A SOI substrate comprising a first buried $SiO_2$ film formed in a silicon substrate and extending substantially parallel to a main surface of said silicon substrate, a second buried $SiO_2$ film extending below said first buried $SiO_2$ film substantially parallel to said main surface, and a crystal defect bridging said first buried $SiO_2$ film and said second buried $SiO_2$ film.

4. A method for manufacturing a SOI substrate comprising a $SiO_2$ film formed in a silicon substrate and extending substantially parallel to a main surface of said silicon substrate, and a plurality of $SiO_2$ islands disposed said $SiO_2$ film and arranged in a direction substantially parallel to said main surface, comprising the steps of: implanting oxygen ions in a silicon substrate, raising an ambient temperature of the silicon substrate wherein the temperature is raised at a rate not higher than 1°/minute over a range of at least 100° above a temperature higher than 600 □ while an ambient oxygen concentration is kept at a level of 0.5% or higher, and heat treating the silicon substrate at a temperature not lower than 1200° for a specified time length.

5. The method for manufacturing the SOI substrate as defined in claim 4, wherein the ambient oxygen concentration is 0.8% or above.

6. The method for manufacturing the SOI substrate as defined in claim 4, wherein said implanting stop doses oxygen ions at a dosage of $2 \times 10^{18}/cm^2$.

7. The method for manufacturing a SOI substrate comprising the steps of:

implanting oxygen ions in a silicon substrate to form a damage peak where crystal defects generated by the ion implantation is maximum and a density peak where a concentration of the implanted oxygen ions is maximum in the silicon substrate; and forming an $SiO_2$ film extending in a direction parallel to a main surface of the silicon substrate and having a center located substantially at the damage peak.

8. The method for manufacturing the SOI substrate as defined in claim 7, wherein a distance between the surface of the silicon substrate and the damage peak is equal to about ¾ of a distance between the surface of the silicon substrate and the density peak.

9. The method for manufacturing the SOI substrate as defined in claim 7, said $SiO_2$ film forming step includes a heat treatment at a temperature of 1200° C. or higher.

10. The method for manufacturing the SOI substrate as defined in claim 7, wherein said heat treatment follows the step of raising a ambient temperature of the silicon substrate wherein the temperature is raised at a rate not higher than 1° C./minute over a range of at least 100° C. above a temperature higher than 600° C. while an ambient oxygen concentration is kept at a level of 0.5% or higher.

11. The method for manufacturing the SOi substrate as defined in claim 10, wherein the ambient oxygen concentration is 0.8% or above.

12. The method for manufacturing the SOI substrate as defined in claim 7, wherein said implanting step doses oxygen ions at a dosage of $2 \times 10^{18}/cm^2$.

13. The method for manufacturing the SOI substrate as defined in claim 7, further comprising the step of forming another $SiO_2$ film having a center at the density peak and extending parallel to the main surface of the silicon substrate.

* * * * *